(12) United States Patent
Cusmano et al.

(10) Patent No.: US 7,719,320 B2
(45) Date of Patent: May 18, 2010

(54) METHOD AND CIRCUIT FOR FILTERING GLITCHES

(75) Inventors: Pietro Cusmano, Palermo (IT);
Floriano Montemurro, Massafra (IT);
Roberto Ruggirello, Trapani (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 1180 days.

(21) Appl. No.: 11/299,044

(22) Filed: Dec. 9, 2005

(65) Prior Publication Data
US 2006/0186927 A1 Aug. 24, 2006

(30) Foreign Application Priority Data
Dec. 10, 2004 (IT) .......................... VA2004A0059

(51) Int. Cl.
*G01R 29/02* (2006.01)
(52) U.S. Cl. ........................................ 327/34; 327/217
(58) Field of Classification Search .................. 327/34, 327/31, 309, 551, 215–218; 375/350
See application file for complete search history.

(56) References Cited
U.S. PATENT DOCUMENTS

| | | | | |
|---|---|---|---|---|
| 4,553,102 A * | 11/1985 | Yoshida | ...................... | 329/310 |
| 5,382,889 A * | 1/1995 | Peters et al. | ........... | 318/400.06 |
| 5,699,387 A * | 12/1997 | Seto et al. | .................... | 375/376 |
| 5,968,083 A * | 10/1999 | Ciciarelli et al. | .............. | 607/62 |
| 6,353,341 B1 * | 3/2002 | Lesea et al. | .................. | 327/34 |
| 6,392,474 B1 | 5/2002 | Li et al. | ...................... | 327/551 |
| 6,670,832 B1 | 12/2003 | Duong | ......................... | 327/34 |
| 2002/0034114 A1* | 3/2002 | Tobita | ......................... | 365/222 |
| 2006/0145727 A1* | 7/2006 | Sribhashyam et al. | ......... | 327/34 |

\* cited by examiner

*Primary Examiner*—Long Nguyen
*Assistant Examiner*—Sibin Chen
(74) *Attorney, Agent, or Firm*—Lisa K. Jorgenson; Allen, Dyer, Doppelt, Milbrath & Gilchrist, P.A.

(57) ABSTRACT

A circuit for filtering glitches that corrupt a digital input signal includes an enable path input with the digital signal and a reset signal. The enable path generates a corresponding active output signal when the reset signal is null and the digital signal assumes a logic active value, or a null output signal when the reset signal is asserted. The circuit also includes a delay line producing an internal signal as delayed replica of the output signal. The circuit further includes a disable path enabled or disabled by the internal signal, which receives the digital signal and, when enabled, asserts the reset signal when the digital signal becomes null.

10 Claims, 6 Drawing Sheets

METHOD AND CIRCUIT FOR FILTERING GLITCHES

FIELD OF THE INVENTION

The invention relates to circuits for filtering glitches, and, more particularly, to a method and a related circuit for filtering glitches in a digital signal.

BACKGROUND OF THE INVENTION

In digital devices located in the presence of relatively slow and/or noisy voltage ramps of input signals, due for instance to the use of pull-up transistors or to synchronization errors, spurious switching of a digital signal may occur. These undue switchings cause spurious pulses, hereinafter called "glitches", that may compromise the proper functioning of the device.

To address this problem, input buffers with hysteresis are used. In some cases, this is not sufficient because the hysteresis is limited by specifications on the minimum voltage $V_{IL}$ and maximum voltage $V_{IH}$, and, therefore, an excessively strong noise that may corrupt an input ramp jeopardizes the effort.

Similarly, the use of an RC filter connected at the output of the input filter, ensures only the filtering of glitches of a duration shorter than the response time of the filter. Moreover, it acts on both (leading and trailing) edges, thus it delays the acknowledging of the logic level of the input signal.

Figure 1:
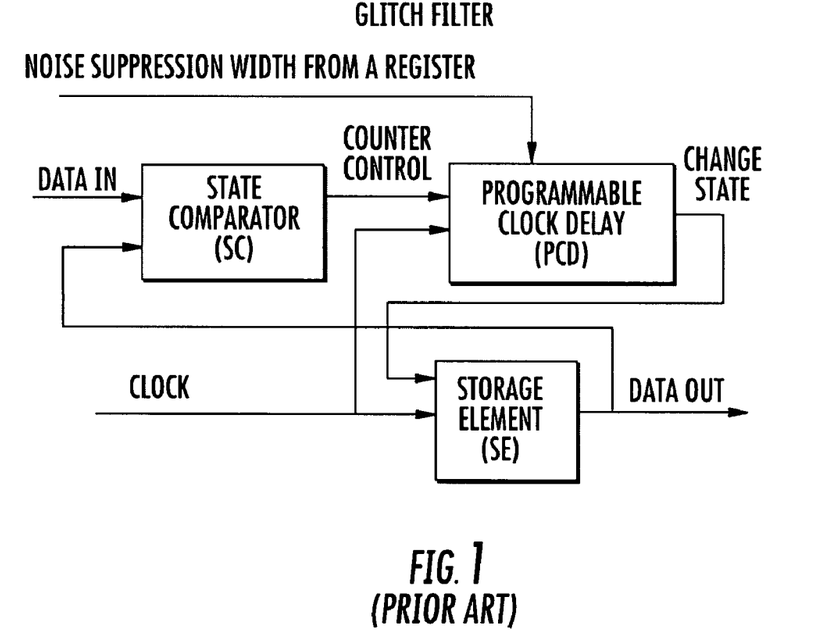
FIG. 1 shows a prior art circuit for filtering glitches disclosed in U.S. Pat. No. 6,535,057.

Clocked circuits for filtering glitches are disclosed in the literature. An example of such a clocked glitch filter is described in U.S. Pat. No. 6,535,057 and depicted in FIG. 1. This approach is burdened in general by the drawback of requiring a high frequency clock signal for obtaining the desired response. Moreover, the glitch filter is unsuitable for asynchronous applications.

Figure 2:
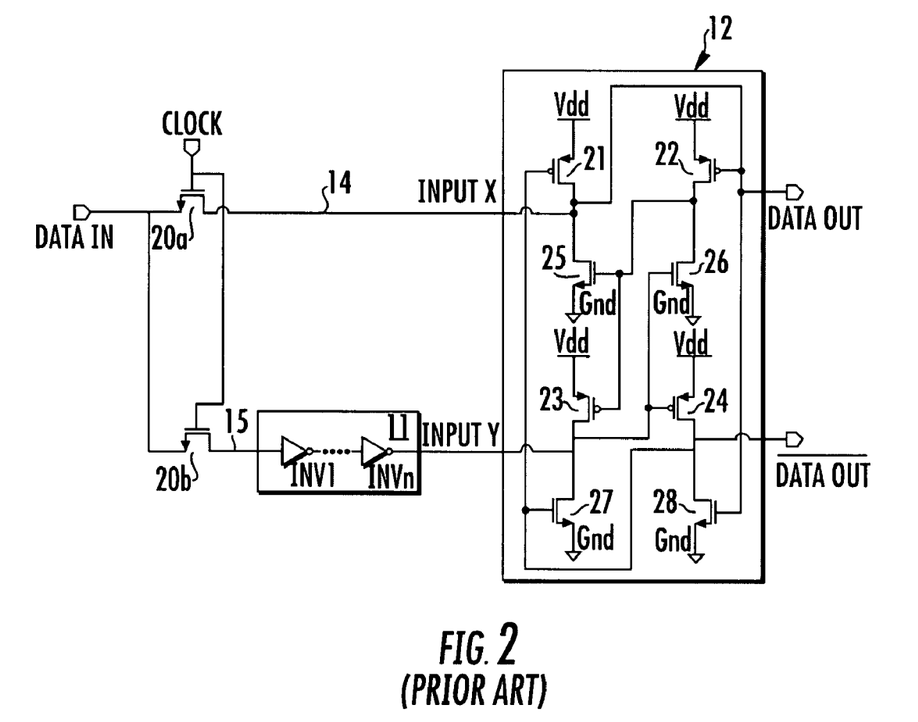
FIG. 2 shows a prior art circuit for filtering glitches disclosed in U.S. Pat. No. 6,392,474.

Circuit architectures functioning without a clock signal have also been proposed. FIG. 2 shows a glitch filter disclosed in U.S. Pat. No. 6,392,474. In this known circuit, the noise input to the delay line 11 is filtered on one of the two branches of an SR latch. The latch is realized in a manner that will make it reliable even under a "Single Event Upset", that is, it will correctly retain the current state even in presence of external events (radiation, electrical interference) that could make the latch switch. In this case, an input pulse lasting slightly longer than the delay introduced by the delay line 11 could cause an output glitch.

Figure 3:
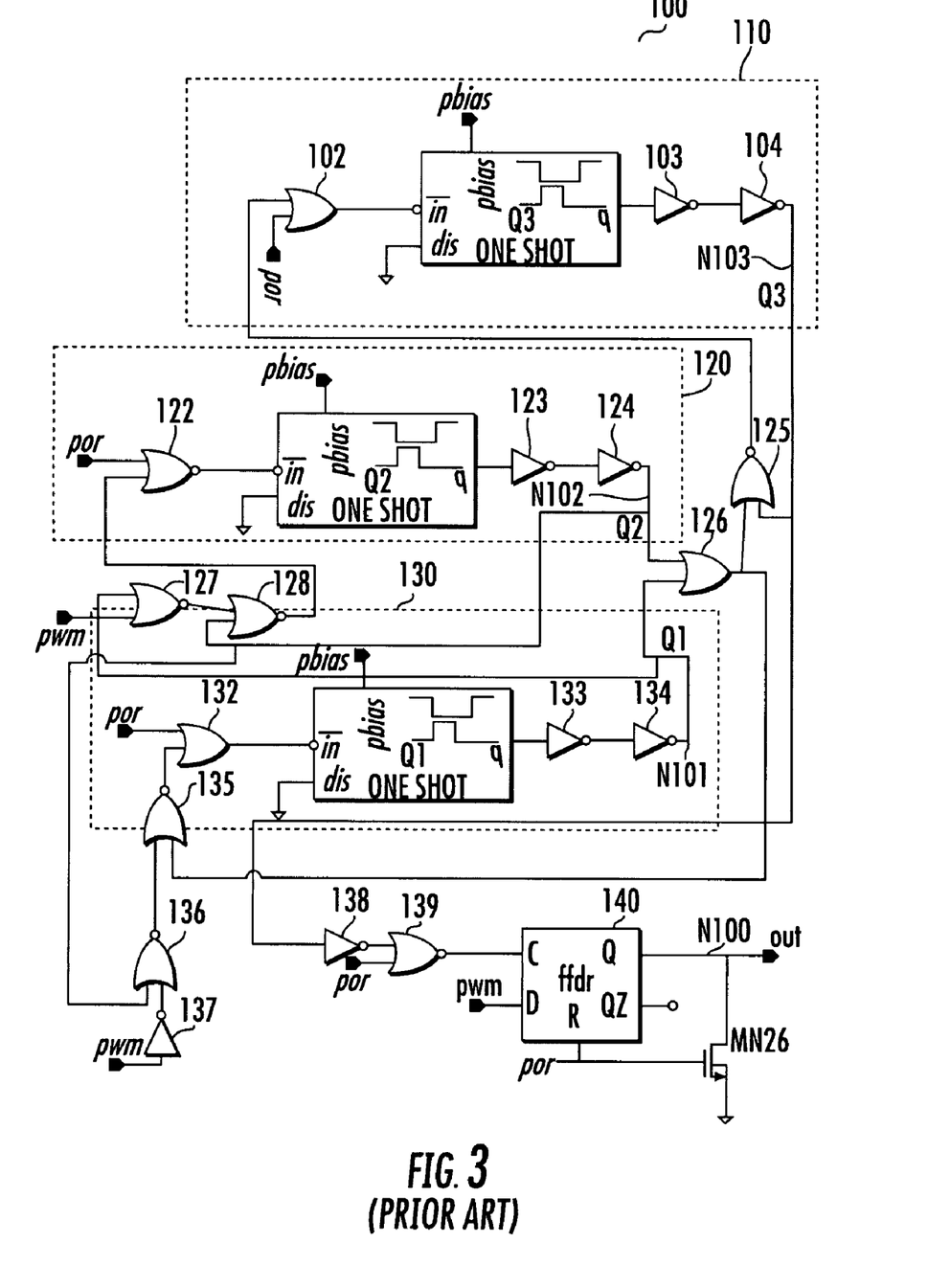
FIG. 3 shows a prior art circuit for filtering glitches disclosed in U.S. Pat. No. 6,670,832.

The circuit for filtering glitches illustrated in FIG. 3 and described in U.S. Pat. No. 6,670,832 addresses this problem. The external POR command forces the output signal OUT in an initial pre-defined state whatever is the logic level of the input PWM signal. When the POR command is not asserted, the logic values of the PWM signal cause the generation or not of pulses from the blocks ONE SHOT, which are transmitted through the filtering circuit to the flip-flop FFDR, that samples the input PWM signal in correspondence with the output edges of the logic gate 139.

The drawback of this known filtering circuit is that the output may be incoherent with the input if the input signal switches while the pulse is generated. Moreover, the filtering circuit has a relatively complex architecture.

SUMMARY OF THE INVENTION

An object of the invention may be to provide a filtering circuit with a relatively simple circuit structure, to improve the filtering of the input noise compared to other known approaches, and to effectively prevent glitches of arbitrary durations. These results may be achieved by enabling and disabling the output signal through two distinct signal paths.

The circuit for filtering glitches may comprise an enable path and a disable path both input with the digital signal corrupted by glitches to be filtered. The two distinct signal paths may be interconnected through a delay line such that the disable path switches the output signal to the low logic value only if it remains active for a time at least equal to the delay of the delay line, and the enable path switches the output signal to the high logic value when the output signal switches active.

More precisely, a method for filtering glitches that corrupt an input digital signal may comprise generating an active output logic signal when the input digital signal assumes an active logic value, or a null output logic signal when the reset signal is asserted. The method may also comprise generating an internal signal as a delayed replica with a certain delay of the output signal. The method may further comprise asserting the reset signal when the internal signal is active and the input digital signal is null.

The method may be implemented in a related filtering circuit.

BRIEF DESCRIPTION OF THE DRAWINGS

The invention will be described in detail referring to the attached drawings, wherein.

DETAILED DESCRIPTION OF THE PREFERRED EMBODIMENTS

Figure 4:
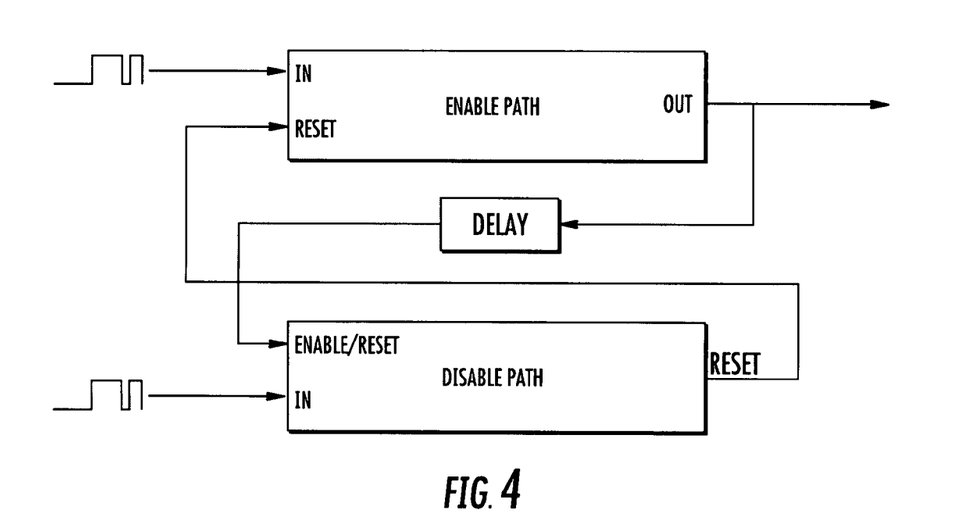
FIG. 4 is a basic scheme of a circuit for filtering glitches in accordance with the invention.

As shown in FIG. 4, a circuit in accordance with the invention illustratively includes three blocks: an enable path ENABLE PATH, a disable path DISABLE PATH, and a delay line DELAY. The enable path generates an output signal OUT that is active for a minimum time Δ when the input signal is active. This enable path may bring the output signal in the null state only if the reset signal RESET is asserted. The disable path DISABLE PATH, when it is active, asserts the reset signal RESET.

The two paths interact and the disable path is enabled by the enable path by the active output signal, transmitted by the delay line DELAY, while the enable path and thus the output signal OUT are disabled by the disable path. Therefore, once the output signal OUT is active, a time at least equal to the delay time established by the delay line must lapse before the signal can switch to the null logic state, which is until the disable path is enabled by the delayed replica of the active output signal. In addition, once the output signal OUT is null, a time at least equal to the delay time established by the delay line lapses before the signal can switch to the active logic state, which is until the disable path is disabled by the delayed replica of the null output signal.

Figure 5:
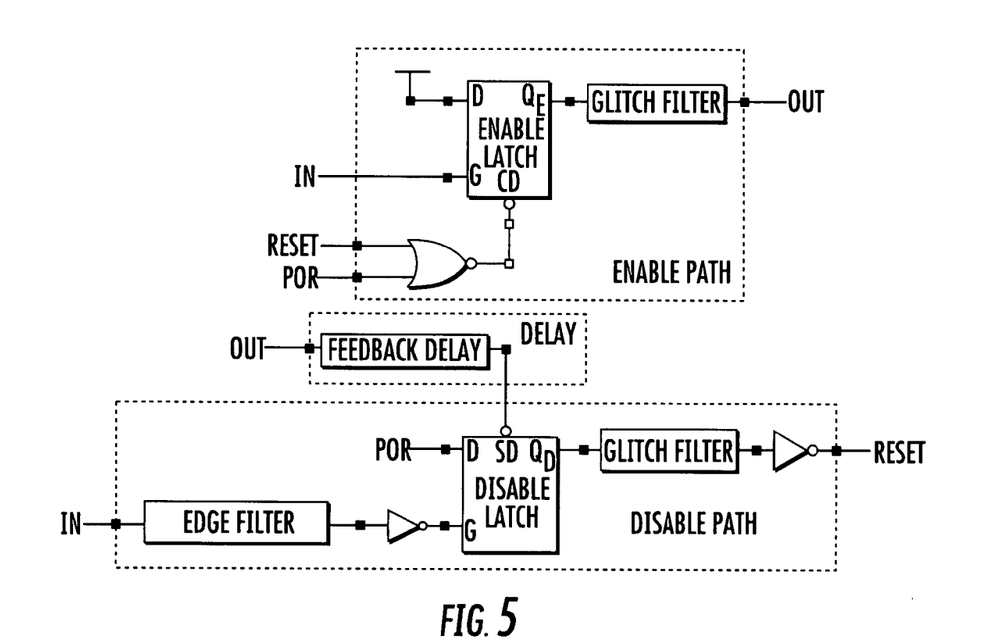
FIG. 5 depicts an embodiment of a circuit for filtering glitches in accordance with the invention.
Figure 8:
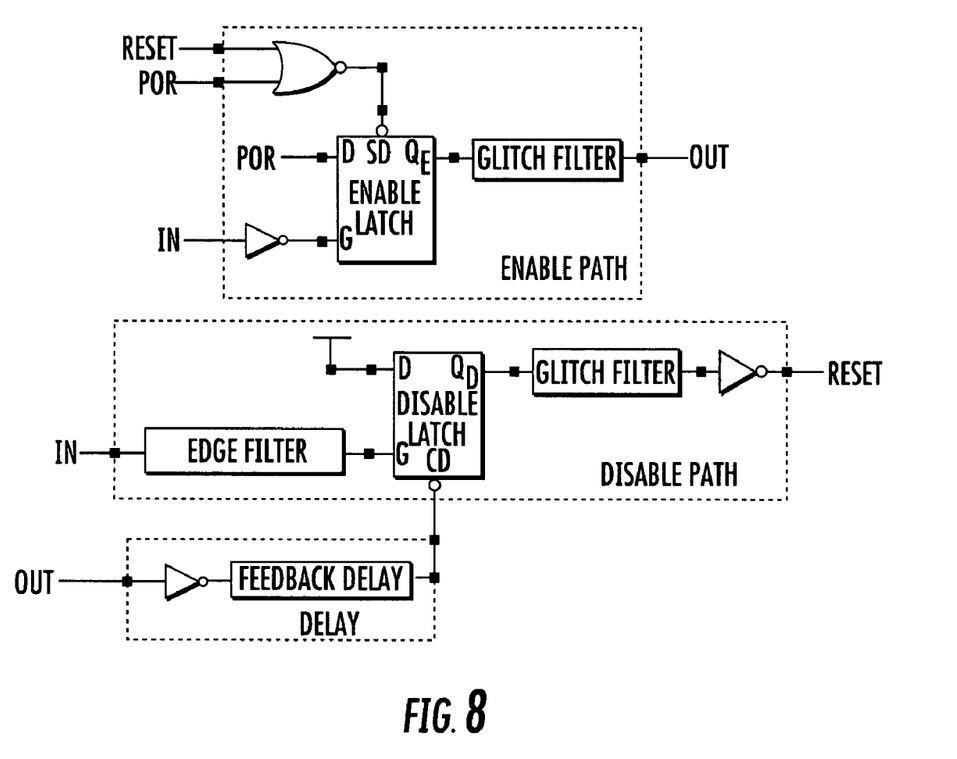
FIG. 8 illustrates an embodiment of the circuit for filtering glitches for negative logic control signals in accordance with the invention.

Sample embodiments for the case of positive and negative logic input signals are illustrated in FIGS. 5 and 8. The signals OUT and RESET are generated respectively by two latches, ENABLE LATCH and DISABLE LATCH. The first latch ENABLE LATCH is disabled when the reset signal or an external POR command are asserted, while the second latch DISABLE LATCH is enabled when the active output signal OUT has propagated through the delay line DELAY.

In the embodiments of FIGS. 5 and 8, a block EDGE FILTER is also shown. It generates an intermediate signal G by delaying the trailing edges (in FIG. 5) or the leading edges (in FIG. 8) of the input signal IN of a pre-established time $t_1$.

Referring to FIG. 5, a negative pulse of duration shorter than the time $t_1$ is not transmitted through the block EDGE FILTER, thus it does not change the state of the signal OUT. Indeed, it may be preferred that the signal IN remains at the null logic state at least for a time $t_1$, for asserting the signal RESET that brings the latch ENABLE LATCH, and thus the output signal OUT again to the null state.

At turn-on, through the external POR command, an initial condition in which the signals OUT and RESET are both null is forced. Thereafter, a leading edge of the input signal IN causes the storing of the active state in the latch ENABLE LATCH, thus the output signal OUT switches to the active state and is kept in this state at least for a time equal to the largest between the time $t_1$ and the delay $\Delta$ of the delay line DELAY.

As a consequence, the latch DISABLE LATCH is enabled once the delay imposed by the line DELAY has lapsed. As soon as a trailing edge of the input signal IN reaches the latch DISABLE LATCH, the reset signal RESET is asserted by sampling the null level of the external POR command.

The minimum duration of pulses of null or active logic level present on the output signal OUT is established by choosing the delay introduced by the delay line and the time $t_1$. By indicating with $\Delta$ the delay introduced by the delay line and with $t_1$ the minimum duration of a negative input pulse that may be transmitted through the block EDGE FILTER, the minimum duration of the pulses of active logic level of the signal OUT is equal to the largest between $t_1$ and $\Delta$, while the minimum duration of the pulses of null logic level of the signal OUT is equal to $\Delta$.

As may be readily understood, the block EDGE FILTER is not essential and is used in the disable path only if it is necessary to increase the minimum duration of the active logic level pulses with respect to that of the null logic level pulses of the output signal OUT, or if it is necessary to reduce the capacity of the filter of recognizing the disable condition. Should it be necessary to increase the minimum duration of the null logic level pulses with respect to that of active logic level pulses, the optional block EDGE FILTER is inserted in the enable path, upstream from the latch ENABLE LATCH.

A block EDGE FILTER is not inserted in the enable path ENABLE PATH so as not to delay the recognition of the active level of the input signal. Optionally, two filters GLITCH FILTER are connected to the output of the two latches to prevent propagation of glitches present on the input signal that violate the pre-established specifications of minimum pulse width of the latches, and thus would not be detected by the latches.

Figure 6A:
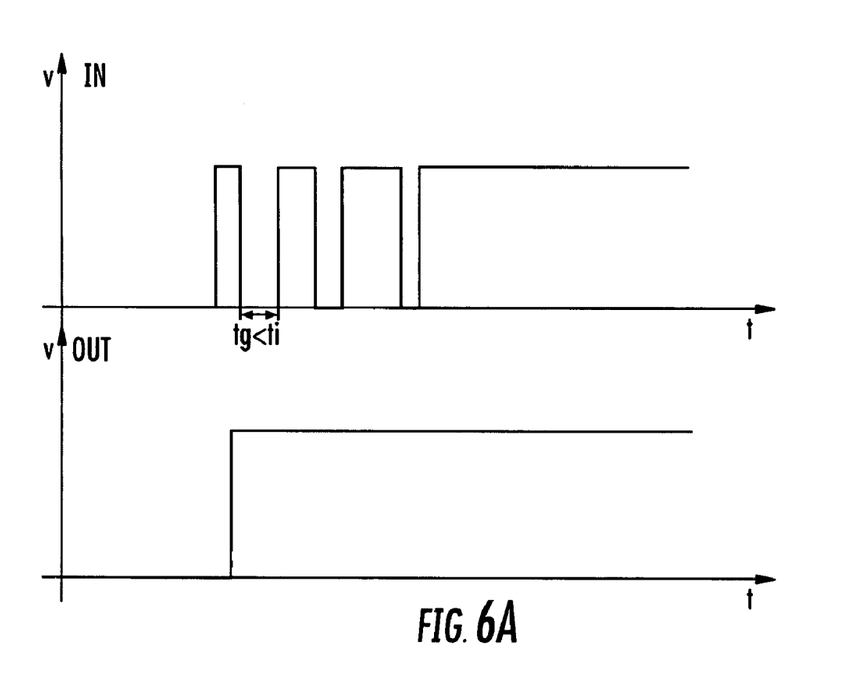
FIGS. 6a and 6b illustrate the functioning of the filter of FIG. 5 in the case of a negative glitch of a duration ($t_g$) shorter or longer than the delay $t_1$, respectively, for an input signal IN that reproduces a typical waveform of the response of an input buffer to a slow and/or noisy rising voltage ramp.
Figure 6B:
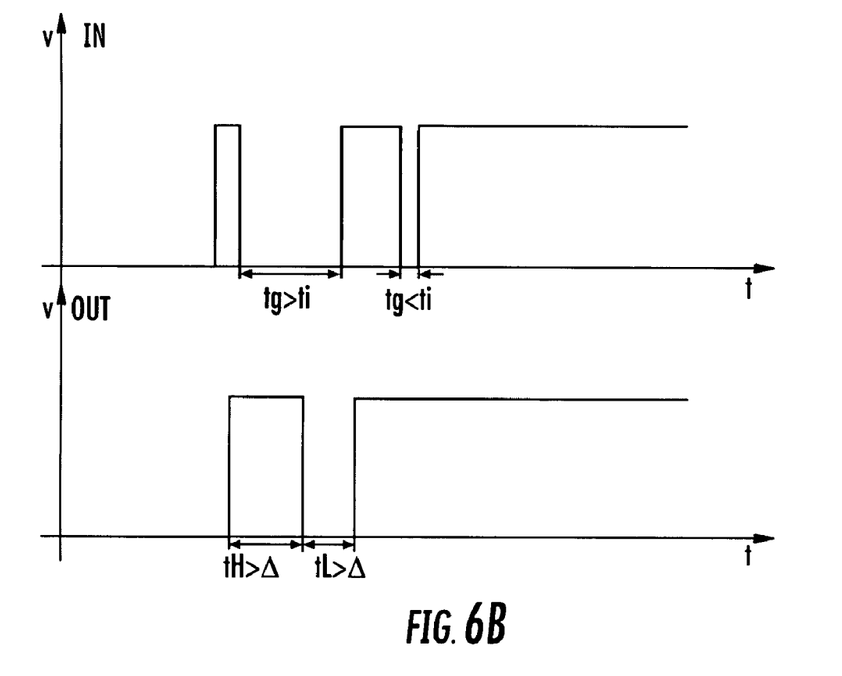
Figure 7A:
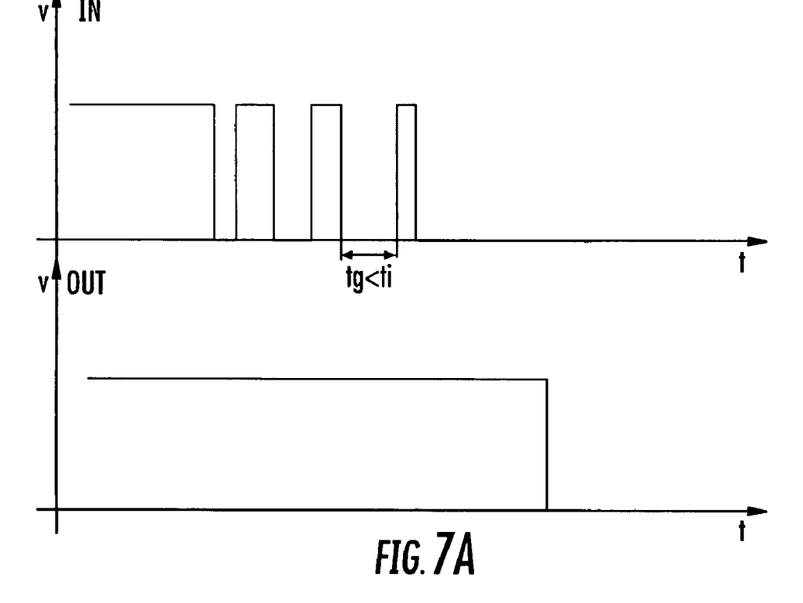
FIGS. 7a and 7b illustrate the functioning of the filter of FIG. 5 in the case of a negative glitch of a duration ($t_g$) shorter or longer than the delay $t_1$, respectively, for an input signal IN that reproduces a typical waveform of the response of an input buffer to a slow and/or noisy falling voltage ramp.
Figure 7B:
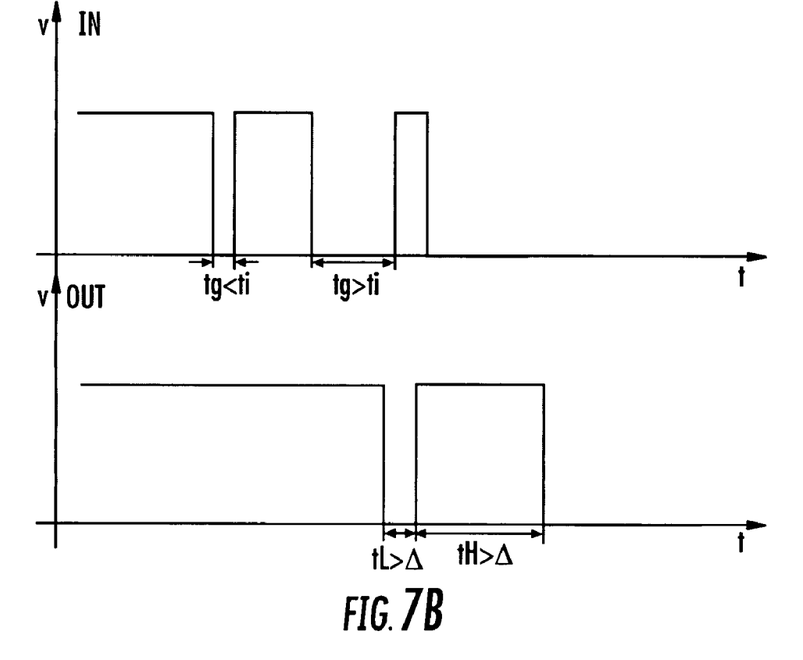

Sample responses of the filtering circuit of FIG. 5 are shown in FIGS. from 6A to 7B. The times $t_L$ and $t_H$ are those during which the output signal remains at null logic value and at active logic value, respectively. FIGS. 6A and 6B show the input signals IN generated as a response of an input buffer to slowly rising and/or noisy ramps, while FIGS. 7A and 7B relate to input signals IN that are produced as responses of an input buffer with slowly falling and/or noisy slopes.

It is evident that the circuit may completely filter the glitches of null logic level of duration $t_g$ shorter than $t_1$. For longer durations, the output signal OUT becomes null for a time shorter than $\Delta$.

The circuit is robust, simple to be realized, and is versatile because it may be adapted to different applications while ensuring a very fast response to the recognition of the enable state. The fact that a clock is not necessary makes the applicant's circuit flexible and usable in innumerable architectures. Thanks to its structure, the circuit has a discrete robustness to a "Single Event Upset", does not internally generate glitches, and may not assume under any circumstance an indefinite state.

That which is claimed is:

1. A circuit for filtering glitches that corrupt a digital input signal, the circuit comprising:
   an enable path circuit input with the digital input signal and a reset signal, generating an output signal active when the reset signal is null and the digital input signal assumes a logic active value, or a logic null value when the reset signal is asserted, and comprising a first latch disabled when the reset signal is asserted for generating a first active intermediate signal when the digital input signal assumes the active logic value;
   a delay line circuit producing an internal signal as a delayed replica of the output signal; and
   a disable path circuit enabled or disabled by the internal signal, which receives the digital input signal and, when enabled, asserts the reset signal when the digital input signal becomes null, and comprising a second latch enabled or disabled by the internal signal, generating a second active intermediate signal when the digital input signal assumes the logic null value.

2. The filtering circuit according to claim 1 wherein said disable path circuit further comprises an edge filter for generating a third intermediate signal as a replica of the digital input signal deprived of pulses of a null logic value of duration shorter than a threshold time, a null state of the third intermediate signal enabling the second intermediate signal.

3. The filtering circuit according to claim 1 further comprising:
   a first glitch filter not detectable by the first latch and the second latch, eventually corrupting the first active intermediate signal, and generating the output signal; and
   a second glitch filter eventually corrupting the second active intermediate signal, and generating an inverted replica of the reset signal.

4. The filtering circuit according to claim 1 wherein said enable path circuit and said disable path circuit generate the logic null value and the reset signal when an external command is asserted.

5. A filtering circuit comprising:
   an enable path circuit input with a digital signal and a reset signal for generating an output signal defining
      an output signal active when the reset signal is null and the digital signal assumes a logic active value, or
      a null output signal when the reset signal is asserted;
   a delay line circuit for producing an internal signal as a delayed replica of the output signal; and a disable path circuit enabled or disabled by the internal signal, which receives the digital input signal, and, when enabled, asserts the reset signal when the digital signal becomes null;

said enable path circuit comprising a first latch disabled when the reset signal is asserted for generating a first active intermediate signal when the digital signal assumes the logic active value;

said disable path circuit comprising a second latch enabled or disabled b the internal signal for generating a second active intermediate signal when the digital signal assumes a logic null value;

said enable path circuit and said disable path circuit generating the null output signal and the reset signal when an external command is asserted.

6. The filtering circuit according to claim 5 wherein said disable path circuit further comprises an edge filter for generating a third intermediate signal as a replica of the digital signal deprived of pulses of a null logic value of duration shorter than a minimum pre-established time, and a null state of the third intermediate signal enabling the second active intermediate signal.

7. The filtering circuit according to claim 5 further comprising:

a first glitch filter not detectable by the first and second latches, eventually corrupting the intermediate signal, generating the output signal; and a second glitch filter similar to the first glitch filter eventually corrupting the second active intermediate signal, generating an inverted replica of the reset signal.

8. A method for filtering glitches with a filtering circuit, the method comprising:

generating an active output signal, with an enable path circuit of the filtering circuit, when a digital input signal assumes an active logic value, or a null output signal when a reset signal is asserted, the enable path circuit comprising a first latch disabled when the reset signal is asserted for generating a first active intermediate signal when the digital signal assumes the active logic value;

generating an internal signal, with a delay line circuit of the filtering circuit, as a delayed replica of the output signal; and asserting the reset signal, with a disable path circuit of the filtering circuit, when the internal signal is active and the digital input signal becomes null, the disable path circuit comprising a second latch enabled or disabled by the internal signal for generating a second active intermediate signal when the digital signal assumes a logic null value.

9. The method according to claim 8 further comprising establishing a delay introduced by the delay line circuit as a function of a threshold duration of pulses of the output signal.

10. The method according to claim 8 wherein the reset signal is asserted when the internal signal is active and the digital input signal becomes null and remains null at least for a threshold time.

* * * * *

UNITED STATES PATENT AND TRADEMARK OFFICE
CERTIFICATE OF CORRECTION

PATENT NO. : 7,719,320 B2  Page 1 of 1
APPLICATION NO. : 11/299044
DATED : May 18, 2010
INVENTOR(S) : Cusmano et al.

It is certified that error appears in the above-identified patent and that said Letters Patent is hereby corrected as shown below:

Column 5, Line 10          Delete: "b"
                           Insert: --by--

Signed and Sealed this

Twenty-fourth Day of August, 2010

David J. Kappos
*Director of the United States Patent and Trademark Office*